United States Patent
Oh et al.

(10) Patent No.: US 8,692,136 B2
(45) Date of Patent: Apr. 8, 2014

(54) METHOD OF REPAIRING PROBE CARD AND PROBE BOARD USING THE SAME

(75) Inventors: Kwang Jae Oh, Gyunggi-do (KR); Joo Yong Kim, Gyunggi-do (KR); Yoon Hyuck Choi, Gyunggi-do (KR); Bong Gyun Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 705 days.

(21) Appl. No.: 12/926,802

(22) Filed: Dec. 9, 2010

(65) Prior Publication Data

US 2012/0013360 A1    Jan. 19, 2012

(30) Foreign Application Priority Data

Jul. 13, 2010    (KR) .................. 10-2010-0067599

(51) Int. Cl.
    *H05K 1/11*    (2006.01)
(52) U.S. Cl.
    USPC ........................................ 174/267
(58) Field of Classification Search
    USPC .................. 174/250, 255, 261, 267
    See application file for complete search history.

(56) References Cited

U.S. PATENT DOCUMENTS

| 4,706,165 | A  |     | 11/1987 | Takenaka et al. |         |
|-----------|----|-----|---------|-----------------|---------|
| 2002/0032961 | A1 |  | 3/2002 | Matsuda |   |
| 2004/0148765 | A1 |  | 8/2004 | Casey et al. |   |
| 2012/0037408 | A1 | * | 2/2012 | Chang et al. | 174/257 |

FOREIGN PATENT DOCUMENTS

| JP | 63-107056     | 5/1988 |
| JP | 2-15693       | 1/1990 |
| JP | 2-16790       | 1/1990 |
| JP | 9-237956      | 9/1997 |
| JP | 2004-241771   | 8/2004 |
| JP | 2009/521697   | 6/2009 |
| KR | 1996-0006713  | 2/1996 |
| KR | 10-0683444    | 2/2007 |
| KR | 10-2011-0028031 | 3/2011 |
| WO | 2007/075070   | 7/2007 |

OTHER PUBLICATIONS

Japanese Office Action issued Oct. 30, 2012 in corresponding Japanese Patent Application No. 2010-282858.
Korean Office Action issued Aug. 26, 2011 in corresponding Korean Patent Application 10-2010-0067599.

* cited by examiner

*Primary Examiner* — Jeremy Norris

(57) ABSTRACT

There are provided a method of repairing a probe card and a repaired probe board. The method of repairing a probe card includes: in a board body composed of a sintered ceramic having first and second pillar surfaces disposed at a position opposed to each other, preparing the board body including a plurality of main channels for electrically connecting a first pad formed on the first pillar surface to a second pad formed on a second pillar surface and reserved channels disposed to be adjacent to the main channels to repair to damaged main channels; when the main channels are damaged; removing the first and second pads formed in the main channels and the reserved channels; forming cavities by partially removing the board between the damaged main channels and the reserved channels adjacent to the main channel; and forming repair connection parts in the cavities in order to electrically connect the damaged main channels to the reserved channels adjacent thereto.

7 Claims, 3 Drawing Sheets

METHOD OF REPAIRING PROBE CARD AND PROBE BOARD USING THE SAME

CROSS-REFERENCE TO RELATED APPLICATIONS

This application claims the priority of Korean Patent Application No. 10-2010-0067599 filed on Jul. 13, 2010, in the Korean Intellectual Property Office, the disclosure of which is incorporated herein by reference.

BACKGROUND OF THE INVENTION

1. Field of the Invention

The present invention relates to a method of repairing a probe card capable of reducing manufacturing costs of a probe board by repairing the probe board through a simple process when wiring defects occur in the probe board and a probe board using the same.

2. Description of the Related Art

Recently, as the use of high-integrated and small-sized products is on the rise, demand for a small-sized board with various functions has been increased.

In order to meet demand, a thickness of a signal line in products having electrical characteristics should be designed and manufactured to be increasingly thin.

In this case, process complexity is increased, which degrades process yield. In the past, a variety of functions were performed by using individual circuit wiring boards. Recently, however, various functions are integrated on a single circuit wiring boards so as to make a size of the board small. As a result, the density of wirings used on the circuit board has increased. Therefore, the number of nets and paths to be actually connected has been increased geometrically. Even in the case that only one of these paths is defective, there is a problem in that the board should be discarded.

Further, during the manufacturing of the circuit wiring board (PCB, LTCC, HTCC, and a ceramic circuit wiring board, or the like) or after the circuit wiring board is manufactured, the quality of the circuit wiring board should be tested before the packaging process or other post-processes are performed on the circuit wiring board. In this case, open or short defects of the net or the path moving electrical signals are generally tested.

However, when the defects occur in products which have already been heat-treated, it is very difficult to repair the defective nets or paths. In this case, the defective board should be generally discarded and then replaced with a new board.

In particular, when the open or short defects occur at the specific nets in the inner layer of the board, it is difficult to repair the board, which causes the problem in which the entire board should be replaced.

SUMMARY OF THE INVENTION

An aspect of the present invention provides method of repairing a probe card capable of reducing the manufacturing costs of a probe board by repairing the probe board through a simple process when wiring defects occur in the probe board and a probe board using the same.

According to an aspect of the present invention, there is provided a method of repairing a probe card, including: preparing a probe board including first and second pillar surfaces opposed to each other, first and second pads formed on the first and second pillar surfaces, a plurality of main channels penetrating through the first and second pillar surfaces and electrically connecting the first and second pads to each other, and reserved channels adjacent to the main channels and repairing damaged main channels; removing the first and second pads formed on the damaged main channels of the plurality of main channels and the reserved channels adjacent thereto; forming cavities by partially removing a board between the damaged main channels and the reserved channels adjacent thereto; and forming repair connection parts in the cavity in order to electrically connect the damaged main channels to the reserved channels adjacent thereto.

When the main channel is damaged, it may be repaired so that an electrical signal transferred to the damaged main channel is transferred to the reserved channel through the repair connection part.

The first and second pads may be removed by a lapping method.

The forming of the repair connection part may include: forming a conductive layer electrically connecting the damaged main channel to the reserved channel adjacent thereto in the cavity; and forming an insulating layer on the conductive layer to planarize the board.

The conductive layer may be composed of a paste including a conductive material.

The insulating layer may be composed of a paste including a dielectric material.

The cavity may be formed by any one of laser etching, chemical etching, and laser drilling.

The method of repairing a probe card may further include, after forming the repair connection part, forming the first pad and the second pad on the first pillar surface and the second pillar surface of the board, respectively.

According to another aspect of the present invention, there is provided a probe board, including: a probe board body including first and second pillar surfaces opposed to each other and first and second pads formed on the first and second pillar surfaces; a plurality of main channels formed in the board body for electrically connecting the first and second pads; at least one reserved channel adjacent to the main channel and replaceable damaged main channels of the plurality of main channels; cavities formed by removing a part of a board between the damaged main channel and the reserved channel adjacent thereto; and a repair connection part formed in the cavity and electrically connecting the damaged main channel to the reserved channel adjacent thereto.

The repair connection part may include: a conductive layer formed in the cavity and electrically connecting the damaged main channel to the reserved channel adjacent thereto; and an insulating layer formed on the conductive layer in order to planarize the board.

The conductive layer may be composed a paste including a conductive material.

The insulating layer may be composed of a paste including a dielectric material.

The repair connection part may include: a conductive layer formed in the cavity and electrically connecting the damaged main channel to the reserved channel adjacent thereto; and an insulating layer formed on the conductive layer in order to planarize the board, wherein the insulating layer is formed with the first and second pads.

The reserved channel may be used as a test channel for testing the board.

The reserved channel may be also used as additional wirings for adding wirings to the board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
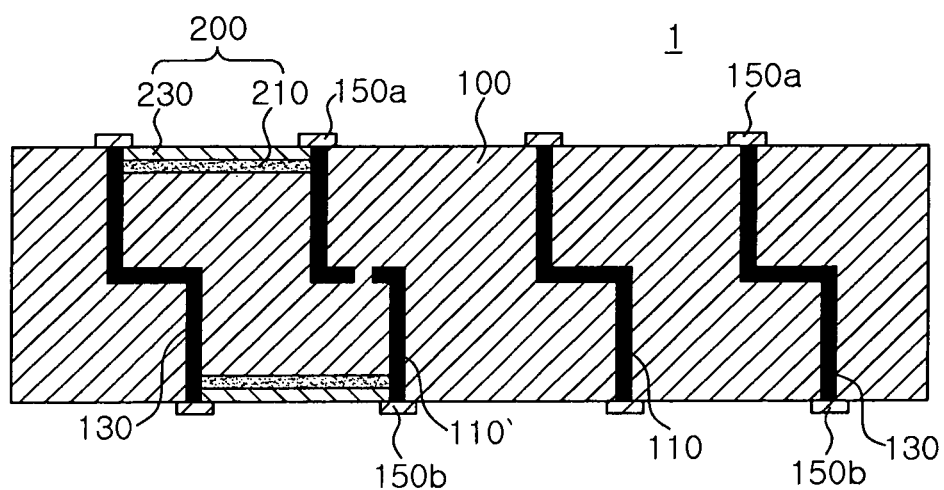
FIG. 1 is a cross-sectional view schematically showing a probe board manufactured according to an exemplary embodiment of the present invention.

Hereinafter, exemplary embodiments will be described in detail with reference to the accompanying drawings so that they can be easily practiced by those skilled in the art to which the present invention pertains. However, in describing the exemplary embodiments of the present invention, detailed descriptions of well-known functions or constructions are omitted so as not to obscure the description of the present invention with unnecessary detail.

In addition, like reference numerals denote parts performing similar functions and actions throughout the drawings.

In addition, unless explicitly described otherwise, "comprising" any components will be understood to imply the inclusion of other components but not the exclusion of any other components.

In order to accomplish the technical problems, a method of repairing a probe card according to an exemplary embodiment of the present invention prepares a board body including a plurality of main channels electrically connecting a first pad formed on a first pillar surface of a board to a second pad formed on a second pillar surface thereof and including a reserved channel adjacent to the main channels to repair damaged main channels, the board being configured to include a sintered ceramic having the first and second pillar surfaces disposed at a position opposed to each other.

When electrical defects occur in the main channel, the first and second pads formed in the main channel and the reserved channel are removed by a method such as lapping, or the like.

Cavities are formed by removing the board body between the damaged main channel and the reserved channel formed to be adjacent to the main channel.

Repair connection parts are formed in the cavity to electrically connect the damaged main channel to the reserved channel adjacent thereto, thereby electrically conducting between the damaged main channel and the reserved channel adjacent thereto.

An electrical signal applied to the repaired main channel may again be transferred to a main channel by connecting the main channel to the reserved channel through the repair connection part.

The repair connection part is manufactured by forming a conductive layer electrically connecting the damaged main channel to the reserved channel adjacent thereto in the cavity and forming an insulating layer on the conductive layer to planarize the board.

The conductive layer is composed of a paste including conductive materials to serve to electrically connect the main channel to the reserved channel and the insulating layer is composed of a paste including dielectric materials to serve to planarize the board while insulating the conductive layer from the outside.

Since the repair connection part is formed in the board, even in the case that the board is repaired, the same conductive pattern as that applied to an unrepaired board may be used by being applied to the board.

After the repair connection part is formed, the first pad and the second pad are formed on the first and second pillar surfaces of the board in order to use the board. When the first and second pads are formed, the unrepaired board and the repaired board may have the same appearance.

That is, the repaired part is formed in the board, such that the external pattern may be formed in the same manner as the unrepaired board.

Further, in the case of the present invention, the reserved channel formed on the board may also be used as a test channel to test the board and may also be used as an additional wiring for adding wirings that are not considered at the time of designing the board.

Hereinafter, a process of repairing a probe board according to an exemplary embodiment of the present invention will be described with reference to FIGS. 1 and 2A to 2G.

FIG. 1 is a cross-sectional view schematically showing a probe board repaired according to an exemplary embodiment of the present invention.

The present invention relates to a probe card. The probe card includes a performance board, a probe board, and a probe.

The performance board is formed in a disc and has a top surface and a bottom surface. The top surface is formed with a prove circuit pattern for an inspection process and a groove is formed between probe circuit patterns adjacent to each other. The bottom surface may be mounted with an interposer, wherein the probe board is connected to the interposer.

A predetermined electrical signal is transferred to the probe board through the performance board through a test apparatus.

A probe formed on the probe board contacts an electrode pad of a chip implemented on a wafer. The predetermined electrical signal transferred through the performance board passes through the electrode pad on the wafer and is then transferred to the test, which tests whether or not the chip implemented on the wafer is normal.

The probe board includes a sintered ceramic, a plurality of conductive bumps formed on the top surface of the sintered ceramic, an organic protective layer formed on the top surface of the sintered ceramic, and a conductive pad formed on the conductive bump.

The sintered ceramic, which has a structure in which a plurality of dielectric layers are stacked, forms a board body. The dielectric layer is formed with an internal circuit patterns and a via electrode connecting the internal circuit patterns to each other.

The internal circuit pattern may include passive devices such as resistor, inductor, capacitor, or the like.

The sintered ceramic according to an exemplary embodiment of the present invention has first and second pillar surfaces disposed so as to be opposed to each other and a board body 100 is formed of the sintered ceramic. The board body 100 is formed with a first pad 150a formed on the first pillar surface and a second pad 150b formed on the second pillar surface.

A plurality of main channels 110 configured to have main wirings formed in the board body are formed to electrically connect the first pad 150a to the second pad 150b.

At least one reserved channel 130 is formed, which is configured to be adjacent to the main channel 110 and have reserved wirings formed in the board that can replace damaged main channels 110' of the main channels.

A repair connection part 200 is formed to electrically connect the damaged main channel 110' to the reserved channel 130 adjacent thereto so that the first pad 150a and the second pad 150b of the damaged main channel 110' are formed in the board body to be electrically connected to each other through the reserved channel 130.

The repair connection part 200 includes a conductive layer 210 composed of a paste including a conductive material to electrically connect the damaged main channel 100' to the reserved channel 130 adjacent thereto.

The repair connection part 200 is an insulating layer 230 that is formed on the conductive layer 210 to insulate the conductive layer 210 from the outside of the board. The conductive layer 210 serves to insulate the conductive layer 210 so that only the signal transferred to the damaged main channel 110' is transferred through the conductive layer 210 of the repair connection part 200. Further, the insulating layer 230 serves to planarize the board and makes the appearance of the board match that of the state of the board before being repaired.

The first pad 150a and the second pad 150b formed on each of the first and second pillar surfaces of the board in which the repair connection part 200 is formed may be reformed.

Therefore, the performance and appearance of the substantially repaired board body 100 are the same as those of a normal board that has not been repaired.

That is, in the case of the normal board, if the electrical signal is applied to the first pad 150a and then, transferred to the second pad 150b through the main channel 110, the electrical signal applied to the first pad 150a passes through the damaged main channel 110', the conductive layer 210 of the repair connection part 200, and the reserved channel 130, when the board body 100 is repaired.

The electrical signal passing through the reserved channel 130 again passes through the damaged main channel 110' and is transferred to the second pad 150b.

Therefore, the normal board and the repaired board are operated similarly and the repair connection part 200 of the repaired board is disposed in the board and includes the insulating layer 230 in order to substantially have the same appearance.

In addition, the reserved channel 130 may be also used as a test channel for performing a test, when the board should be additionally tested.

When additional wirings that are not considered at the time of designing the board are required, the reserved channel 130 is used as the additional wirings without needing to remanufacture the board, such that the board may still be used.

That is, the board may be used for various purposes, such that the flexibility of the board is increased.

FIGS. 2A to 2G are process flow charts showing a method of repairing the board.

Figure 2A:
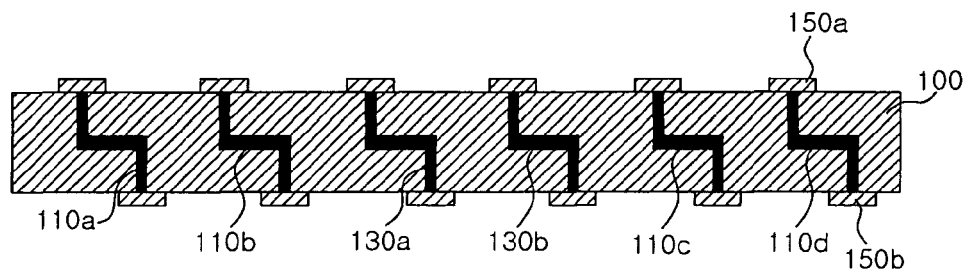
FIGS. 2A to 2G are cross-sectional views schematically showing a process of repairing the probe board according to the exemplary embodiment of the present invention.

FIG. 2A shows a process of preparing the board body including the plurality of main channels 100 for electrically connecting the first pad 150a formed on the first pillar surface to the second pad 150b formed on the second pillar surface and the reserved channel 130 for repairing, in the board body composed of the sintered ceramic having the first and second pillar surfaces disposed at a position opposed to each other.

The board body 100 is manufactured in a multi-layer board type composed of the sintered ceramic and the main channel 110 and the reserved channel 130, which is a channel transferring the electrical signal, is made of a conductive material.

A plurality of main channels 110a, 110b, 110c, and 110d formed of a plurality of main wirings for electrically connecting the first pad 150a formed on the first pillar surface to the second pad 150 formed on the second pillar surface are formed on the board body 100.

The board body 100 is also formed with the reserved channel 130 formed to be adjacent to the main channel and configured to have the reserved wirings for repairing the damaged main channels.

Figure 2B:
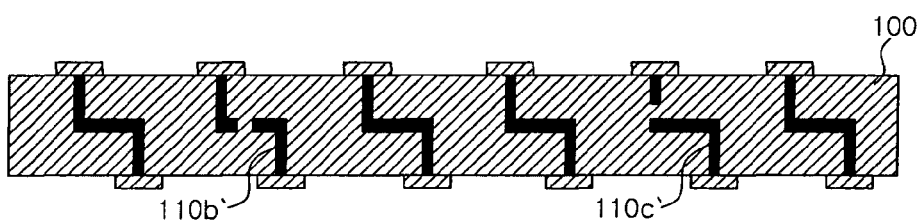
Figure 2C:
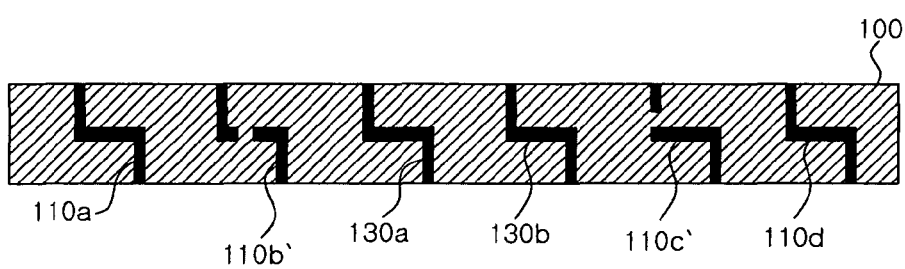

FIGS. 2B and 2C show a process of removing the first and second pads formed in the main channel and the reserved channel, when the main channel is damaged.

FIG. 2B is a cross-sectional view showing the damaged board. When the electrical defects occur in the probe board 1, the damaged main channels 110b' and 110c' exist in the board body 100.

Referring to FIG. 2C, the board body 100 in which the damaged main channels 110b' and 110c' are disposed may be obstacles in the subsequent processes for repairing the board, since the first pad 150a and the second pad 150b attached to the first and second pillar surfaces of the board are composed of the conductive material for repairing the board. Therefore, the first pad 150a and the second pad 150b exposed on the board surface are removed by a process such as lapping, or the like.

Figure 2D:
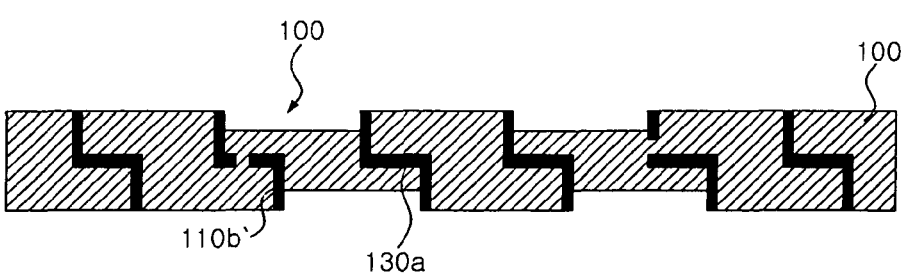

FIG. 2D shows a process of partially removing the board between the damaged main channel and the reserved channel adjacent to the main channel to form a cavity 170.

The damaged main channels 110b' and 110c' and the cavity 170 are not limited thereto; however, the board body 100 between the damaged main channels 110b' and 110c' and reserved channels 130a and 130b adjacent thereto may be partially removed by any one of laser etching, chemical etching, and laser drilling methods.

Figure 2E:
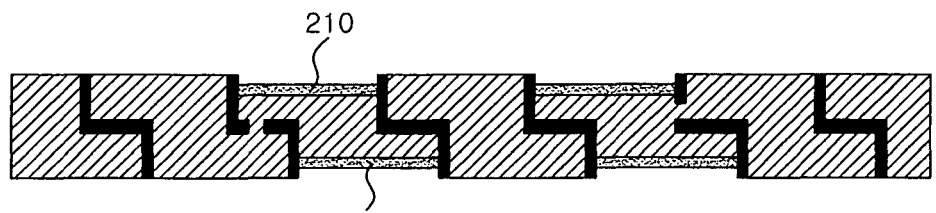
Figure 2F:
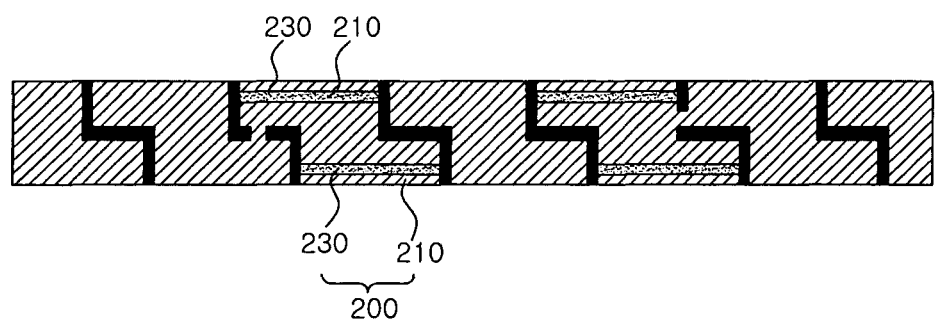

FIGS. 2E and 2F show a process of forming the repair connection part 200 in the cavity 170 to electrically connect the damaged main channels 110b' and 110c' to the reserved channels 130a and 130b adjacent thereto.

The cavity 170 formed in the board body 100 is formed between the damaged main channels 110b' and 110c' and the reserved channels 130a and 130b for replacing the damaged main channels 110b' and 110c' by a method such as the laser etching, or the like. The cavity 170 is formed with the repair connection part 200 formed of the conductive layer 210 and the insulating layer 230.

Referring to FIG. 2E, the repair connection part 200 includes the cavity 170 composed of a paste including the conductive material in order to electrically connect the damaged main channels 110b' and 110c' to the reserved channels 130a and 130b. The reserved channels 130a and 130b for replacing the damaged main channels 110b' and 110c' are electrically connected to each other by the conductive layer 210 of the repair connection part 200.

Referring to FIG. 2F, the repair connection part 200 includes the insulating layer 230 electrically insulating the conductive layer from the outside by applying a paste including a dielectric material to the cavity 170 in which the conductive layer 210 is formed. Therefore, the repair connection part 200 is electrically insulated from the outside of the board.

The paste including the dielectric material serves to planarize the board. That is, the paste serves to fill the cavity 170 formed between the damaged main channels 110b' and 110c' and the reserved channels 130a and 130b. The areas between the damaged main channels 110b' and 110c and the reserved channels 130a and 130b of the board body 100 are flat, similar to their state before the cavity 170 is formed. Therefore, the appearance of the board body 100 is similar to the state before being repaired. The repair connection part 200 is formed in the board.

Figure 2G:
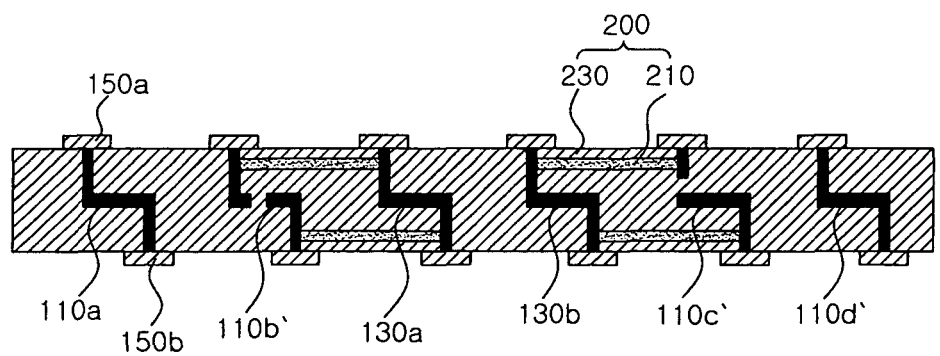

FIG. 2G shows a process of forming the first pad 150*a* and the second pad 150*b* on the first and second pillar surfaces of the board, respectively, after forming the repair connection part.

The first pad 150*a* and the second pad 150*b* are again generated on the repaired board body 100 by the above-mentioned method and are used.

Without being limited thereto, the first pad 150*a* and the second 150*b* are formed by methods, such as screen printing, photolithography, deposition, plating, chemical etching, or the like.

The probe board repaired according to the present invention has the same appearance as the normal probe board. In addition, when the main channel is damaged, the electrical signal transferred to the damaged main channel is transferred to the reserved channel through the repair connection part.

When the electrical signal is applied to the first pad 150*a* of the normal probe board, it passes through the main channel 110 and reaches the second pad 150*b*.

Similarly, when the electrical signal is applied to the first pad 150*a* of the repaired probe board, it passes through the main channel 110 and the repair connection part 200, i.e., the reserved channel 130 and then, passes through the main channel 110 and reaches the second pad 150*b*.

As a result, the repaired probe board has the same appearance as a normal probe board and is operated in the same manner.

The reserved channels 130*a* and 130*b* formed on the probe board according to the present invention may be used for other purposes.

After the board is manufactured, when the additional test is needed, the reserved channels 130*a* and 130*b* may be used as a test port.

Further, when the additional wirings that are not considered at the time of manufacturing the board are required, the method of repairing the probe card is applied so that when the main channel is damaged, the electrical signal transferred to the damaged main channel is transferred to the reserved channel through the repair connection part. The reserved channels 130*a* and 130*b* may be also used as additional wirings.

The probe board may be flexibly used to meet various purposes by forming the reserved channels 130*a* and 130*b* for repairing.

As set forth above, according to the exemplary embodiments of the present invention, it is possible to repair the probe board by a simple process and reuse the defective probe board by repairing the probe board in a nondestructive manner, when defects occur, thereby making it possible to reduce the manufacturing costs thereof.

Further, the present invention provides reserved channels in the probe board to repair the probe board using a simple process when the board defects occur as well as to use the reserved channel as the test channel testing the probe board and the reserved channel as the additional wirings of the probe board.

While the present invention has been shown and described in connection with the exemplary embodiments, it will be apparent to those skilled in the art that modifications and variations can be made without departing from the spirit and scope of the invention as defined by the appended claims.

What is claimed is:

1. A probe board, comprising:
    a probe board body including first and second pillar surfaces opposed to each other and first and second pads formed on the first and second pillar surfaces;
    a plurality of main channels formed in the board body for electrically connecting the first and second pads;
    at least one reserved channel adjacent to the main channel and replaceable damaged main channels of the plurality of main channels;
    cavities formed by removing a part of a board between the damaged main channel and the reserved channel adjacent thereto; and
    a repair connection part formed in the cavity and electrically connecting the damaged main channel to the reserved channel adjacent thereto.

2. The probe board of claim 1, wherein the repair connection part includes:
    a conductive layer formed in the cavity and electrically connecting the damaged main channel to the reserved channel adjacent thereto; and
    an insulating layer formed on the conductive layer in order to planarize the board.

3. The probe board of claim 2, wherein the conductive layer is composed of a paste including a conductive material.

4. The probe board of claim 2, wherein the insulating layer is composed of a paste including a dielectric material.

5. The probe board of claim 1, wherein the repair connection part includes:
    a conductive layer formed in the cavity and electrically connecting the damaged main channel to the reserved channel adjacent thereto; and
    an insulating layer formed on the conductive layer in order to planarize the board,
    the insulating layer being formed with the first and second pads.

6. The probe board of claim 1, wherein the reserved channel is used as a test channel for testing the board.

7. The probe board of claim 1, wherein the reserved channel is used as additional wirings for adding wirings to the board.

* * * * *